US005314781A

United States Patent [19]

Balk

[11] Patent Number: 5,314,781

[45] Date of Patent: May 24, 1994

[54] PROCESS FOR DEVELOPING BLUEPRINTS UTILIZING AMMONIA DEVELOPER CONTAINING SODIUM CHLORITE TO REDUCE AMMONIA ODOR IN THE DEVELOPED BLUEPRINT PAPER

[76] Inventor: Ronald L. Balk, 3440 Eastern, NE., Grand Rapids, Mich. 49505

[21] Appl. No.: 757,556

[22] Filed: Sep. 11, 1991

[51] Int. Cl.$^5$ .................................................. G03F 7/26

[52] U.S. Cl. ..................................... 430/150; 430/146; 430/149; 430/154; 430/368

[58] Field of Search ............... 430/150, 368, 149, 154, 430/146, 147, 148; 354/300

[56] References Cited

U.S. PATENT DOCUMENTS 2,546,791 3/1951 Slifkin et al. ........................ 430/150

OTHER PUBLICATIONS

"Ammonia Odor Controlled", Reproduction Paper News Bulletin, Andrews Paper & Chemical Co., No. 48, Dec. 1965.

*Primary Examiner*—Charles L. Bowers, Jr.
*Assistant Examiner*—Christopher G. Young
*Attorney, Agent, or Firm*—Waters & Morse

[57] ABSTRACT

A blueprint developing solution and process for developing blueprints, wherein the ammonia odor in the blueprints is reduced without eliminating the odor of the developing solution, comprising the incorporation of an effective amount of sodium chlorite in the developing solution or the addition of the vapor products of an aqueous sodium chlorite solution to the developing chamber of a blueprint developing machine.

20 Claims, 2 Drawing Sheets

PROCESS FOR DEVELOPING BLUEPRINTS UTILIZING AMMONIA DEVELOPER CONTAINING SODIUM CHLORITE TO REDUCE AMMONIA ODOR IN THE DEVELOPED BLUEPRINT PAPER

BACKGROUND OF THE INVENTION

This invention relates to a process and product for developing blueprints, wherein the developed blueprint does not exhibit the characteristic, unpleasant smell of ammonia.

The process for producing blueprints is well known. The desired image is produced on a translucent paper, and this paper is placed over a light sensitive blueprint paper and exposed to ultraviolet light. The blueprint paper is then treated with a developing chemical in the form of a strong base, generally ammonia. The ammonia activates dyes in the unexposed areas of the paper that produce a blue or other color image (depending on the color of the dye used) on the paper.

The active chemicals in blueprint paper are diazo compounds. These are light sensitive compounds that decompose and produce no image (white) when exposed to ultraviolet light. Blueprint paper is impregnated with both diazo compounds and a composition called a coupler, which couples with diazo compounds to produce azo dyes. In blueprint paper, the diazo compounds and coupler are in the presence of a stablizing acid barrier, which prevents premature coupling. Blueprints are developed by exposing the paper to a strong base that neutralizes the acid. This permits coupling and causes the release of azo dyes in unexposed areas lying under the image to be reproduced.

Ammonia is a gas at room temperature but can be liquefied under pressure or can be placed in solution with a suitable liquid such as water. Ammonia is used in blueprint developing machines in both forms. Ammonia vapor, either provided directly from liquid ammonia or by vaporization from a water solution of ammonia, permeates the blueprint paper and activates the dyes in the paper. This typically occurs in an enclosed developing chamber in a blueprint developing machine at an elevated temperature of about 170°-210° F., depending on the system. When the blueprint paper is removed from the developing chamber, the blueprint image is on the paper, but the paper also retains a certain amount of ammonia in the fibers of the paper. This gives the blueprint copies an unpleasant odor characteristic of ammonia.

It is desirable that a developing solution of ammonia (whether it be liquid ammonia or an ammonia-water solution) retain its characteristic odor of ammonia, because such a solution produces highly concentrated ammonia fumes that are very toxic at the concentration levels found in a blueprint developing solution. The characteristic odor of ammonia is an important safeguard for persons using this material.

On the other hand, the level of ammonia in a developed blueprint is of such a low level that toxicity is no concern and the odor is merely an annoyance.

A number of attempts have been made to reduce or eliminate the odor of blueprints, but none to date have been adequately successful.

One purpose of the present invention is to provide a means for eliminating the odor of ammonia from developed blueprints without eliminating the warning odor provided by ammonia in a developing solution itself.

SUMMARY OF THE INVENTION

In accordance with the present invention, an improved developing solution for developing blueprints is produced by incorporating in an ammonia developing solution an effective amount of sodium chlorite.

A low level of sodium chlorite is all that is required to reduce the odor of ammonia in developed blueprints. The addition of less than 1% by weight of sodium chlorite in an aqueous solution of ammonia at a developing concentration of about 26° Baume virtually eliminates the odor of ammonia from the developed blueprint without eliminating the odor from the developing solution itself. At these low concentration levels, sodium chlorite has no noticeable effect on the effectiveness of the ammonia solution as a developing solution and does not produce any undesirable deposits or residues in the developing equipment. However, if there should be a leak in the developing system or in the developing chamber whereby a concentrated ammonia vapor is released to the atmosphere, the characteristic odor of ammonia will warn the operator to stay clear of the ammonia vapors.

DETAILED DESCRIPTION OF PREFERRED EMBODIMENT

Figure 1:
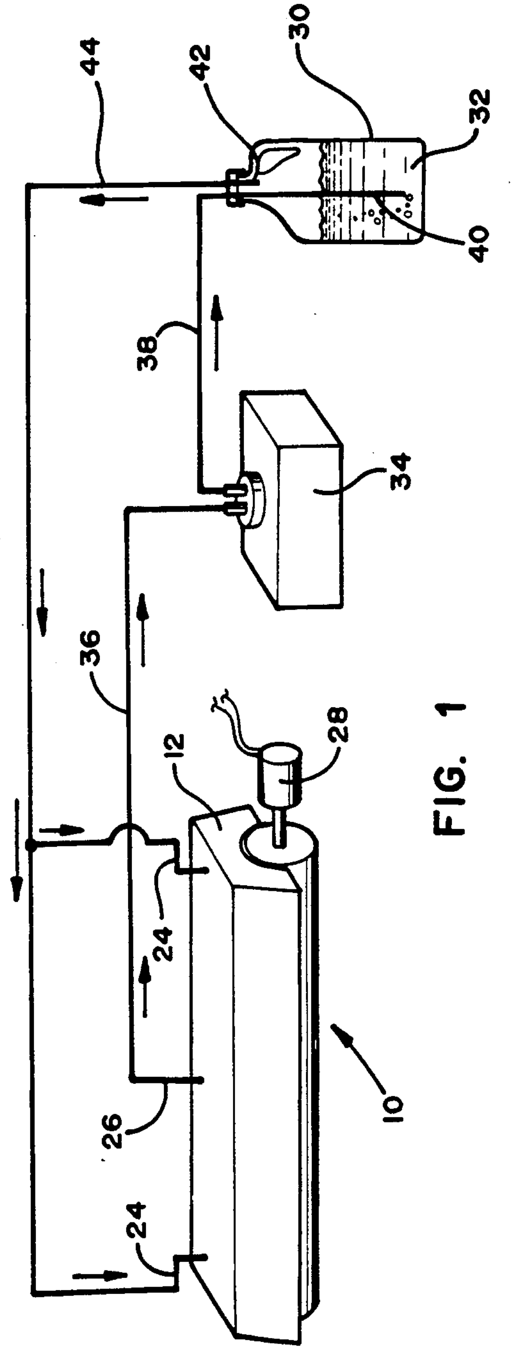
FIG. 1 is a schematic pictorial view of a blueprint developing machine known as a bubbler that uses the vapor from an aqueous solution of ammonia as a developing solution.

Referring to the drawings, a conventional blueprint developing machine 10 of the type known as a bubbler comprises a sealed developing compartment 12, wherein blueprint paper 14 is received after it has been exposed to light through a translucent drawing paper on which the desired image has been placed. The developing chamber has a curved lower surface that fits closely over and mates with a roller 16 that transports the blueprint paper through the space between the roller and the curved lower surface 15 of the developing chamber. The curved lower surface 15 is formed from a perforated teflon screen that permits vapor permeation downwardly from the developing compartment into the blueprint paper at a position between input and output seals 17 and 19.

The developing process is augmented by the use of a heater 18 in the roller or a heater 20 in the chamber or a heater 22 above the chamber or a combination of any of the three. The heater is a conventional heater that heats the chamber typically to a temperature of about 170°-180° F.

The developer has inlets 24 at opposite ends of the elongated developing chamber and an outlet 26 at the center of the developing chamber. A motor 28 rotates the roller to transport blueprints through the developer.

A humidified ammonia vapor is provided to the developing chamber 12 from a container 30, which contains an aqueous solution of ammonia at a concentration level of about 26° Baume, which represents about 29% ammonia by weight of water.

A gas pump 34 withdraws gas from outlet 26 through conduit 36 and then discharges the gas through conduit 38 from an outlet nozzle 40 below the liquid level in the container 30. The gas bubbles through the container inducing vaporization of the ammonia and pressurizing the container to some degree.

Vaporized ammonia is forced through outlet 42 and conduit 44 to inlets 24 in the developer.

Figure 4:
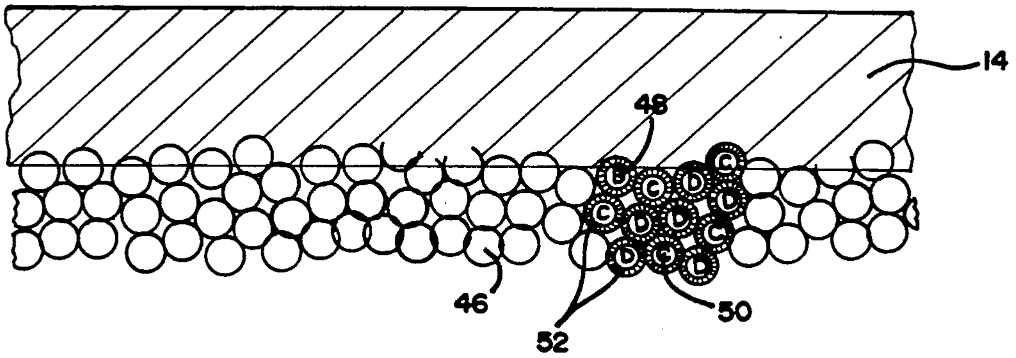
FIG. 4 is a schematic cross sectional view of blueprint paper showing in pictorial form the dye and coupler components of the paper.

The action of the ammonia gas on the paper is diagrammed in FIG. 4, which shows pictorially the composition of blueprint paper that has been exposed to light. The blueprint paper contains diazo compounds 46 which have been exposed to ultraviolet light and decomposed (so as to produce a white color) and diazo compounds 48 that were positioned under the image to be reproduced and have not been exposed to light. The diazo compounds are impregnated in the paper along with a composition 50 called a coupler. When a coupler combines with a diazo compound that has not decomposed, an azo dye is produced, which gives the blueprint paper its characteristic blue image. The coupler and diazo compound, however, do not combine when they are in the presence of an acid barrier 52 which is also present in the blueprint paper. The acid barrier in effect constitutes a shield that prevents the coupling reaction.

Figure 3:
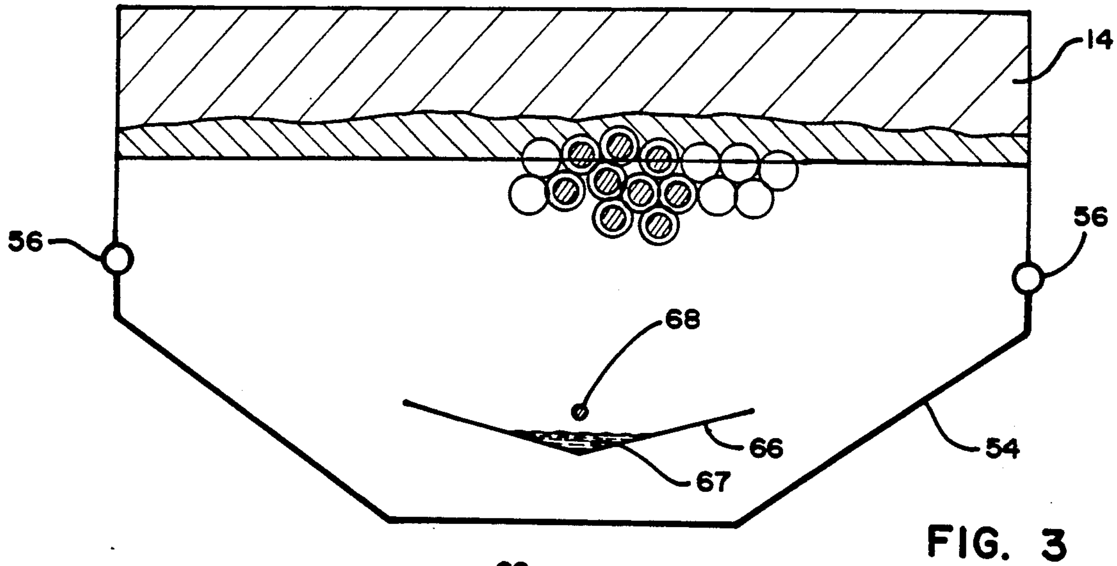
FIG. 3 is a schematic cross sectional view of a different type of blueprint developing tank that uses aqueous or anhydrous ammonia as a developing solution.

As shown in FIG. 3, when the blueprint paper is exposed to a strong base, such as an ammonia vapor, the ammonia vapor penetrates the paper and neutralizes the acid barrier. This permits the diazo compound and the coupler to combine to form the azo dye that produces the image on the paper.

Figure 2:
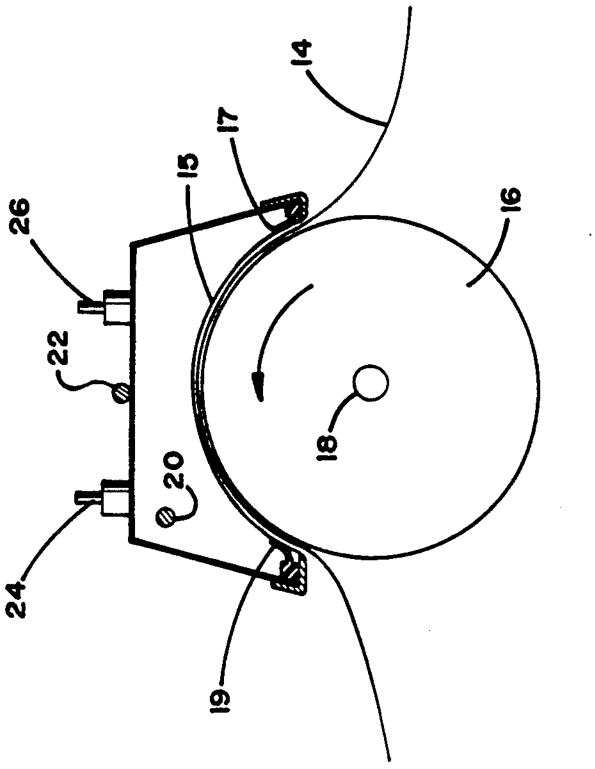
FIG. 2 is a cross sectional view of the developer tank of FIG. 1.

While the illustration in FIG. 3 is merely schematic, it does represent another type of conventional blueprint developing machine. While the bubbler 10 shown in FIGS. 1 and 2 is useful for a relatively low volume blueprint operation, a somewhat different process is used for high volume blueprint developing. In FIG. 3, a sealed developing chamber 54 is positioned below the blueprint paper 14 with seals 56 (illustrated schematically) sealing the space between the developing paper and the chamber. A perforated plate or the like separating the paper and the developing chamber is not shown, for illustrative purposes. Nor is a transport roller or the like, which also would be used with such a system.

With an apparatus of the type shown in FIG. 3, an aqueous ammonia solution of approximately the same concentration as described above can be introduced directly into the developer tank and heated in order to produce an ammonia vapor that permeates the blueprint paper positioned at the upper side of the developing chamber. The incorporation of an aqueous ammonia solution in the developing tank itself facilitates higher speed developing processes. The developing chamber is maintained at a temperature of about 170°-180° F. in such an operation.

Figure 5:
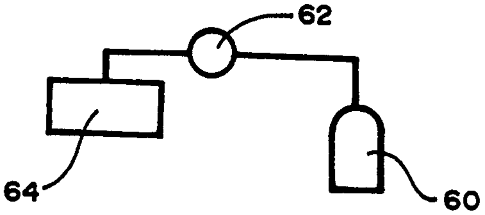
FIG. 5 is a schematic diagram showing a blueprint developing process that uses anhydrous ammonia.

The same type of apparatus shown in FIG. 3 can be used for a so-called anhydrous developing process, wherein ammonia vapor is provided by the vaporization of pressurized, liquefied ammonia. As shown in FIG. 5, in such a system, a pressurized tank of liquid ammonia 60 is connected through a pressure control valve 62 to a sealed developing chamber 64 in a blueprint developing machine. In such a process, it is necessary to humidify the developing chamber in order to promote the neutralization of the acidic barrier with the ammonia vapor. Water 67 is introduced into the developing chamber 54 into a water trough 66 positioned adjacent the heater 68. The chamber is maintained at a temperature of about 210° F. This enhances vaporization of the water and facilitates the developing process. Desirably, the humidity in the chamber is maintained at a level of about 65% to 85% relative humidity and preferably about 80% relative humidity.

The present invention reduces odors from finished blueprints in all of the foregoing developing processes. To accomplish this in an aqueous ammonia process, a small amount of sodium chlorite is incorporated into the aqueous ammonia developing solution that is provided to or heated in the developing chamber. In the preferred practice of the present invention, two (2) liquid ounces of a selected solution of a sodium chlorite is added to one hundred ten (110) liquid ounces of an aqueous ammonia solution having a concentration of about 26 degrees Baume (which is typical for an ammonia developing solution). The selected sodium chlorite solution conveniently is a water solution of sodium chlorite, containing about 2½% by weight of sodium chlorite. With the preferred sodium chlorite and ammonia solution, the sodium chlorite is less than One Percent (1%) by weight of the active ingredients in the developing solution. This virtually eliminates the ammonia odor from finished blueprints but does not affect developing effectiveness and does not eliminate the odor from the developing solution itself.

The sodium chlorite solution desirably contains not only sodium chlorite but also small amounts of a buffering or stabilizing agents. Desirably, the selected sodium chlorite solution contains about 0.1% by weight sodium percarbonate and 0.02% by weight sodium bicarbonate. Desirably, the sodium chlorite is maintained at a pH of about 8.0 to 9.0.

In an anhydrous system, the sodium chlorite can be introduced into the developing process by incorporation in the humidification water 67 introduced into the developing chamber. Preferably, about eight (8) liquid ounces of the selected sodium chlorite solution (2½% by weight sodium chlorite) is added to each gallon of humidifying water 67 introduced into the chamber, with enough water being added to produce a relative humidity in the chamber of about 65-85% and preferably about 80%.

The exact mechanism by which the invention operates is not known. However, the invention works. Developed blueprints are virtually odorless, whereas the developing solution still maintains the strong characteristic odor of ammonia. In experimentation with the present invention, it has been observed that the odor of ammonia is virtually eliminated as long as the ammonia in the atmosphere is no greater than about fifteen (15) parts per million. As the ammonia level increases above that point, the ammonia odor becomes more noticeable. With strong solutions of ammonia, the ammonia loses little of its warning pungency that provides an important safety warning to persons who are required to handle these toxic chemicals.

The presence of sodium chlorite, particularly at these low levels, in the developing solution causes no noticeable change in the developing efficiency of the chemicals. There is not enough sodium chlorite in the solution to dilute the effectiveness if the developer or to produce residue in the system.

The present invention may be formulated either by incorporation into the developing solution at the time of manufacture or it may be packaged as an additive to existing ammonia developing solutions, in which case the person using the blueprint developer would add a small amount of a solution of the present invention to existing supplies of ammonia developer prior to the use of the developer in the developing machine. The selected 2½% sodium chlorite solution is desirably formulated with 2 liquid ounces of solution being added to 110 liquid ounces of 26 degree Baume ammonia solution. Other proportions also will work. Significant odor reduction is achieved with as little as one ounce of the selected sodium chlorite solution in 110 ounces of ammonia solution. Odor reduction is effective no matter how much sodium chlorite is used, but the masking of odor may be too effective for safety purposes if more than about four (4) ounces of the selected solution is used with 110 ounces of the ammonia solution.

The foregoing is representative of the preferred practice of the present invention. Various modifications may be made in the practice of the present invention without departing from the spirit and scope of the invention, which is defined in the appended claims.

I claim:

1. An improved ammonia developing solution for developing blueprints, wherein the developing solution comprises an effective amount of sodium chlorite to reduce the ammonia odor in the developed blueprint paper without eliminating the characteristic warning odor of ammonia in the developing solution.

2. A blueprint developing solution according to claim 1 wherein the sodium chloride in the developing solution comprises less than about one percent (1%) by weight of the active ingredients in the developing solution.

3. A blueprint developing solution according to claim 1 wherein the developing solution contains pH limiting ingredients that cause the pH of the developing solution to be in the range of 8.0 to 9..0 pH.

4. A blueprint developing solution according to claim 3 wherein the pH limiting ingredients comprise sodium perborate and sodium bicarbonate.

5. A process for reducing the ammonia odor in blueprints comprising the step of developing the blueprints with an ammonia developing solution that comprises an aqueous solution of sodium chlorite in an amount that is effective to reduce the ammonia odor in the developed blueprint paper without eliminating the characteristic warning odor of ammonia in the developing solution..

6. A process for developing blueprints with an ammonia based developer, wherein the odor of ammonia in the finished blueprints is reduced, comprising the step of treating blueprint paper with an ammonia based developer that incorporates an effective amount of sodium chlorite in the developer, the amount of sodium chlorite used being sufficient to reduce the odor of ammonia in developed blueprints but being insufficient to materially affect the developing performance of the ammonia developer.

7. A process for developing blueprints comprising treating exposed blueprint paper with vapor from an aqueous solution of ammonia, the improvement comprising admixing sodium chlorite in the aqueous solution in an amount sufficient to reduce the ammonia odor from the developed blueprints without eliminating the ammonia odor from the aqueous solution.

8. A process for developing blueprints comprising developing blueprint paper in a developing chamber by ammonia vapor obtained from a pressurized source of liquid ammonia, introducing water into the developing chamber and heating the water in order to produce a humidified atmosphere in the developing chamber, the improvement comprising incorporating an effective amount of sodium chlorite in the water introduced into the developing chamber to reduce the odor of ammonia in the developed blueprints.

9. A method for reducing the ammonia odor from prints developed by exposing photosensitive paper to ammonia vapor comprising exposing the prints to the vapor products of an aqueous solution of sodium chlorite in an amount sufficient to reduce the odor in the prints.

10. A process for developing blueprints with an ammonia-based developer comprising treating exposed blueprint paper with ammonia vapor and a vaporized aqueous solution of sodium chlorite, the amount of sodium chlorite being sufficient to reduce the odor of ammonia in the developed blueprints.

11. A process according to claim 10 wherein the blueprint paper is treated with anhydrous ammonia vapor in a developing chamber while maintaining the atmosphere in the developing chamber at a humidity of 65–85% relative humidity by heating an aqueous solution of sodium chlorite in the chamber.

12. A process according to claim 11 wherein the aqueous solution of sodium chloride comprises about eight (8) liquid ounces of a sodium chlorite additive solution containing two and one-half percent (2½%) by weight of sodium chlorite admixed with each gallon of water in the aqueous solution, with the humidity in the chamber being maintained at about 80% relative humidity.

13. A process according to claim 10 wherein the amount of sodium chlorite is sufficient to substantially reduce the odor of ammonia in the developed blueprints but is insufficient to materially adversely affect the performance of the ammonia developer.

14. A process according to claim 10 wherein the aqueous solution of sodium chlorite is admixed with an aqueous ammonia developing solution and the developing solution is heated so as to produce a humidified ammonia vapor, the blueprint paper being exposed to the vapor, the sodium chlorite being present in an amount sufficient to reduce the ammonia odor of the developed blueprints but not sufficient to eliminate the characteristic warning odor of ammonia from the developing solution.

15. A process according to claim 14 wherein the sodium chlorite comprises less than one percent (1%) by weight of the active ingredients in the developing solution.

16. A process according to claim 14 wherein the developing solution further comprises sodium percarbonate and sodium bicarbonate in amounts sufficient to stabilize and buffer the sodium chlorite to a pH of 8.0 to 9.0.

17. A process for reducing the ammonia odor in blueprints that are developed by exposing the blueprints in a developing chamber to the vapor products of an aqueous ammonia developing solution, comprising admixing with the ammonia developing solution an effective amount of sodium chlorite to reduce the odor of ammonia in the developed blueprints.

18. A process according to claim 17 wherein the amount of sodium chlorite is sufficiently low that the characteristic odor of ammonia is not eliminated for the developing solution.

19. A process according to claim 18 wherein the developing solution containing the sodium chlorite is heated to about 170°-180° F. in the developing chamber to develop the blueprints.

20. A process according to claim 17 wherein the ammonia developing solution comprises ammonia at a concentration level of about twenty-six (26) degrees Baume, and the sodium chlorite added thereto is in the form of an aqueous sodium chlorite solution comprising about two and one-half (2½%) by weight sodium chlorite, the sodium chlorite solution being added to the developing solution in the ratio of about two (2) ounces of sodium chlorite solution to one hundred ten (110) ounces of developing solution.

* * * * *